United States Patent [19]
Hamajima

[11] Patent Number: 5,969,401
[45] Date of Patent: Oct. 19, 1999

[54] SILICON ON INSULATOR SUBSTRATE WITH IMPROVED INSULATION PATTERNS

[75] Inventor: Tomohiro Hamajima, Tokyo, Japan

[73] Assignee: NEC Corporation, Tokyo, Japan

[21] Appl. No.: 08/989,664

[22] Filed: Dec. 12, 1997

[30]  Foreign Application Priority Data

Dec. 13, 1996  [JP]  Japan ................................. 8-333190

[51] Int. Cl.⁶ ............................................... H01L 29/00
[52] U.S. Cl. .................... 257/501; 257/506; 257/500; 257/328; 257/329; 257/341
[58] Field of Search .................... 257/328, 329, 257/341, 342, 347, 349, 354, 500, 501, 506

[56]  References Cited

U.S. PATENT DOCUMENTS 5,461,253  10/1995  Tsuruta et al. .......................... 257/501
5,844,294  12/1998  Kikuchi et al. ......................... 257/501

FOREIGN PATENT DOCUMENTS 4-29353  1/1992  Japan .

*Primary Examiner*—Minh Loan Tran
*Attorney, Agent, or Firm*—Young & Thompson

[57]  ABSTRACT

The present invention provides a silicon-on-insulator substrate comprising a first silicon substrate, a second silicon substrate bonded to the first silicon substrate, a plurality of insulation film patterns formed on a plurality of first type regions of an interface between the first and second silicon substrate, so that the first and second silicon substrates on the plurality of first type regions are indirectly bonded through the plurality of insulation film patterns while the first and second silicon substrates on a plurality of second type regions are directly bonded to each other, wherein each of the plurality of first type regions is bounded on all sides by the plurality of second type regions while each of the plurality of second type regions is bounded on all sides by the plurality of first type regions.

19 Claims, 4 Drawing Sheets

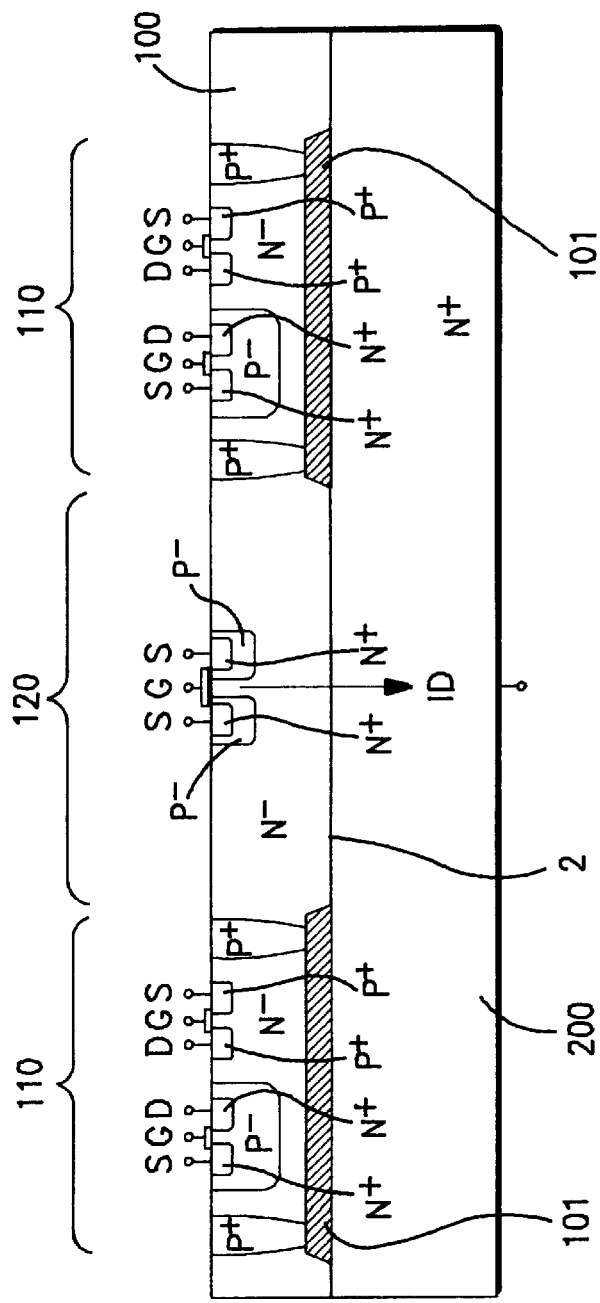

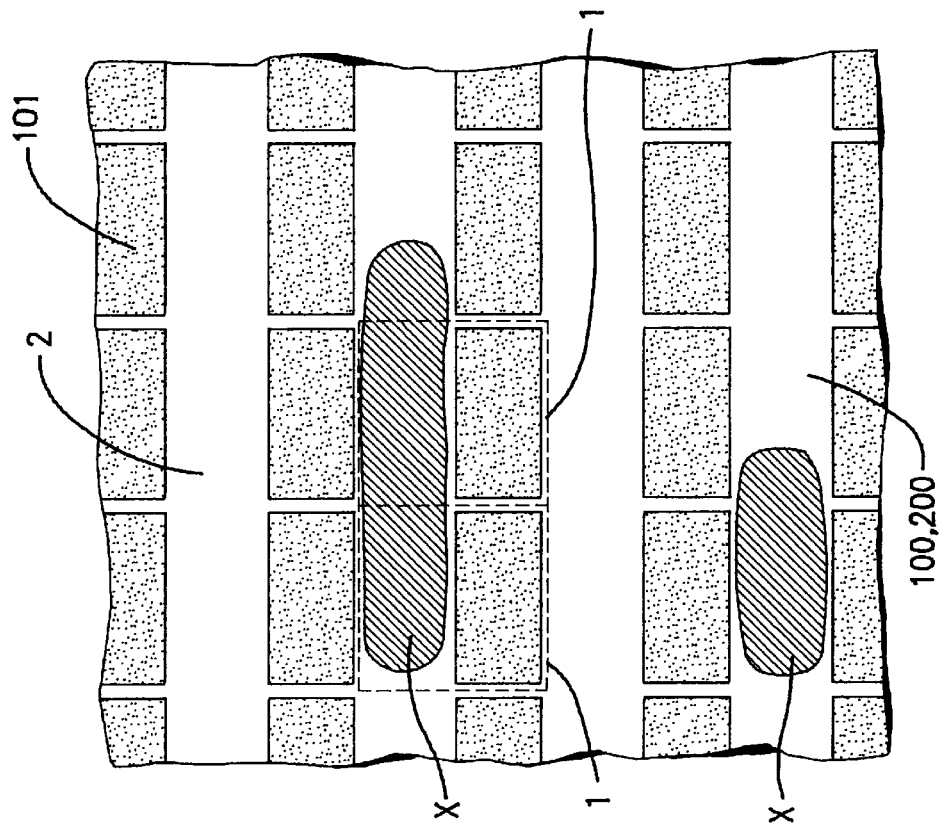
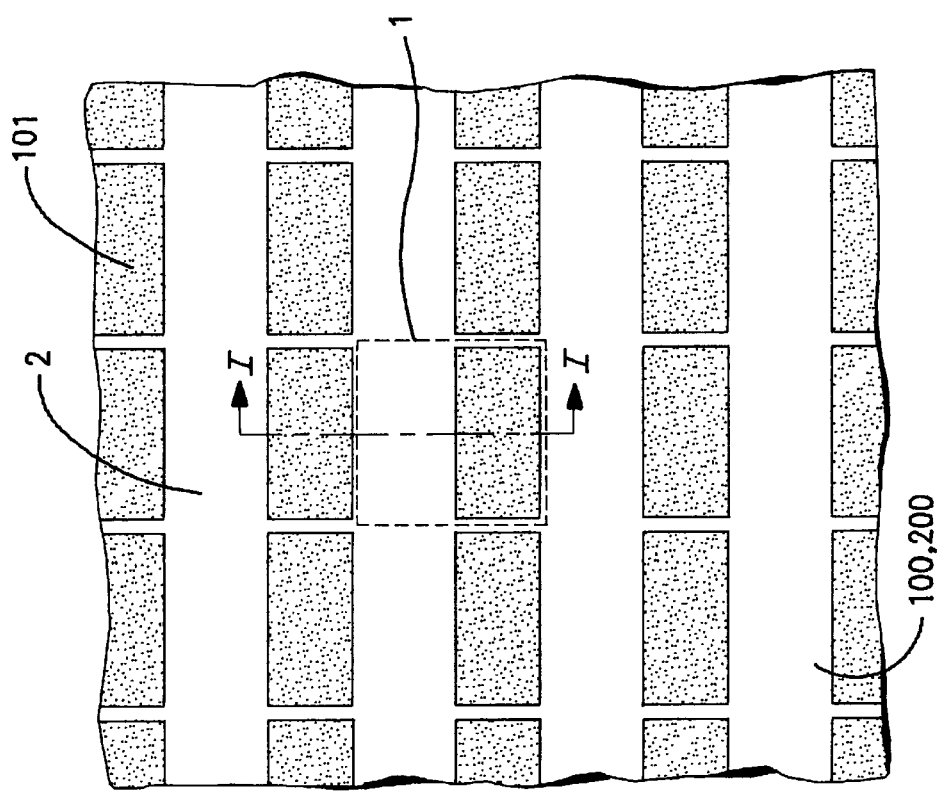
FIG. 3
PRIOR ART
FIG. 2
PRIOR ART

SILICON ON INSULATOR SUBSTRATE WITH IMPROVED INSULATION PATTERNS

BACKGROUND OF THE INVENTION

The present invention relates to an SOI substrate, and more particularly to improvements in insulation patterns provided on an interface between a pair of semiconductor substrates.

In recent years, the applications for multi-layered substrates bonded to each other such as silicon-on-insulator substrate (SOI substrate) have increased as bonding techniques have improved. The SOI substrate has an insulation buried layer such as a buried silicon oxide layer to act as a dielectric isolation substrate for high voltage devices such as power devices. For the power devices, it is required to increase the density of integration thereof, a high voltage and a high reliability. In these circumstances, a development of a new device so called "Intelligent Power Device" has recently been becoming active. In order to realize the intelligent power device, the silicon-on-insulator structure is partially and selectively formed in the substrate in order to integrate both a vertical power MOS field effect transistor circuit and a control circuit onto a single chip. This intelligent power device is, for example, disclosed in Japanese laid-open patent publication No. 4-29353.

FIG. 1 is a fragmentary cross sectional elevation view illustrative of a conventional intelligent power device wherein integration of control circuit regions 110 and a vertical power MOS field effect transistor circuit region 120 is shown. The SOI substrate has laminations of first and second monocrystal silicon substrates 100 and 200 bonded with each other. Silicon oxide patterns 101 are selectively provided on the control circuit regions 110 and on an interface between the first and second monocrystal silicon substrates 100 and 200. The silicon oxide film patterns 101 serve as the buried insulation film buried in the SOI substrate. Namely, in the control circuit regions 110, the first and second monocrystal silicon substrates 100 and 200 are indirectly bonded to each other through the silicon oxide film patterns 101. In the vertical power MOS field effect transistor circuit region 120, the first and second monocrystal silicon substrates 100 and 200 are directly bonded to each other. Control circuits are formed in the control circuit regions 110 whilst a vertical power MOS field effect transistor circuit is provided in the vertical power MOS field effect transistor circuit region 120. In the vertical power MOS field effect transistor circuit, a vertical power MOS field effect transistor has diffusion layers formed in a surface region of the first monocrystal silicon substrate 100. In the vertical power MOS field effect transistor circuit region 120, a drain electrode of the vertical power MOS field effect transistor is provided on a surface of the second monocrystal silicon substrate 200. The vertical power MOS field effect transistor flows a drain current from the diffusion layers toward the drain electrode through the interface between the first and second monocrystal silicon substrates 100 and 200. Namely, the interface between the first and second monocrystal silicon substrates 100 and 200 in the vertical power MOS field effect transistor circuit region 120 serves as a drain current path. This requires a physically and electrically perfect bonding between the first and second monocrystal silicon substrates 100 and 200 in the vertical power MOS field effect transistor circuit region 120.

In the plan view, the silicon oxide film patterns 101 are periodical based upon the individual chip size. FIG. 2 is a plan view illustrative of the conventional silicon oxide film patterns 101 of the above described SOI substrate shown in FIG. 1. The silicon oxide film patterns 101 comprise a plurality of parallel alignments of silicon oxide films rectangular-shaped in lateral direction, where the parallel alignments are separated from each other by the direct bonding regions 2, each of which is stripe-shaped to separate the adjacent two alignments of the rectangular-shaped silicon oxide films. The square area represented by broken lines correspond to the single chip area 1. The single rectangular-shaped silicon oxide film shears the bottom half part of the single chip area 1 whilst the directly bonding region shares the top half part of the single chip area 1. FIG. 1 is the cross sectional elevation view taken along I—I line in FIG. 2.

Electrical properties of the conventional power MOS field effect transistors were evaluated by the inventor of the present invention to confirm the facts that deterioration in the device properties is likely to appear depending upon the shapes of patterns of the silicon oxide films and the arrangements thereof. A bonding imperfection on the interface between the first and second monocrystal silicon substrates 100 and 200 was investigated. As a result, it was understood that a void representing the bonding imperfection or unbonded regions extends over a plurality of adjacent chip areas and the void causes the deterioration of the device performance. FIG. 3 is a plan view illustrative of the insulation patterns and voids on the interface between the first and second monocrystal silicon substrates 100 and 200 of the SOI substrate shown in FIG. 2. Each void is observed by ultrasonic examination. Each void is likely to extend in a direction parallel to the alignments of the silicon oxide film patterns 101. Namely, the deterioration of the device performance is likely to appear along the direction parallel to the alignments of the silicon oxide film patterns 101.

The above void may be caused by differences in flatness of and heat treatment to the first and second monocrystal silicon substrates 100 and 200 of the SOI substrate. Actually, however, it is difficult to bond the first and second monocrystal silicon substrates 100 and 200 without formation of any void on the interface between them. The directly bonding regions are inferior in bonding property than the indirectly bonding regions on which the silicon oxide film patterns 101 are provided on the interface between them. For this reason, the probability of formation of the void is higher in the directly bonding regions rather than the indirectly bonding regions on which the silicon oxide film patterns 101 are provided on the interface between them. Further, the formation of the voids is caused by a difference in level or a step between the silicon oxide film patterns and the monocrystal silicon substrate surface. Conditions for the formation of the silicon oxide films vary over positions of the substrate surface whereby some of the silicon oxide film patterns are higher in level than the monocrystal silicon substrate surface. In this case, the step or difference in level is formed between the silicon oxide film patterns and the monocrystal silicon substrate surface. For this reason, the indirect bonding between the first and second monocrystal silicon substrates 100 and 200 through the silicon oxide film pattern 101 is obtained prior to the direct bonding between the first and second monocrystal silicon substrates 100 and 200 without the silicon oxide film pattern 101. If the step or difference in level between the silicon oxide film patterns and the monocrystal silicon substrate surface is not so small, then the indirect bonding between the first and second monocrystal silicon substrates 100 and 200 through the silicon oxide film pattern 101 is obtained, whilst the direct bonding between the first and second monocrystal silicon substrates 100 and 200 without the silicon oxide film pattern 101 is difficult to obtain. Namely, the voids are likely to be formed in the direct bonding regions. Since the voids are caused by the difference in level between the silicon oxide film patterns and the monocrystal silicon substrate surface or difference in bonding conditions, the voids are likely to extend to the adjacent chip area. Allowance of such extensions of the voids to the adjacent chip area results in reduction in yield of the chips.

In the above circumstances, it had been required to develop a novel SOI substrate with improved insulator patterns free from the above problems.

SUMMARY OF THE INVENTION

Accordingly, it is an object of the present invention to provide a novel SOI substrate with improved insulator patterns free from the above problems.

It is a further object of the present invention to provide a novel SOI substrate with improved insulator patterns which are capable of preventing any voids from extending to the adjacent chip area.

It is still a further object of the present invention to provide a novel SOI substrate with improved insulator patterns which are capable of ensuring perfect bonding between a pair of monocrystal silicon substrates.

It is yet a further object of the present invention to provide a novel SOI substrate with improved insulator patterns which are capable of keeping high yields of chips.

The above and other objects, features and advantages of the present invention will be apparent from the following descriptions.

The present invention provides a silicon-on-insulator substrate comprising a first silicon substrate, a second silicon substrate bonded to the first silicon substrate, a plurality of insulation film patterns formed on a plurality of first type regions of an interface between the first and second silicon substrate, so that the first and second silicon substrates on the plurality of first type regions are indirectly bonded through the plurality of insulation film patterns whilst the first and second silicon substrates on a plurality of second type regions are directly bonded with each other, wherein each of the plurality of first type regions is bounded on all sides by the plurality of second type regions whilst each of the plurality of second type regains is bounded on all sides by the plurality of first type regions.

BRIEF DESCRIPTION OF THE DRAWINGS

Preferred embodiments according to the present invention will be described in detail with reference to the accompanying drawings.

FIG. 1 is a fragmentary cross sectional elevation view illustrative of a conventional intelligent power device.

FIG. 2 is a plan view illustrative of the conventional silicon oxide film patterns 101 of the SOI substrate shown in FIG. 1.

FIG. 3 is a plan view illustrative of the conventional insulation patterns and voids on the interface between the first and second monocrystal silicon substrates 100 and 200 of the SOI substrate shown in FIG. 2.

FIG. 5 is a fragmentary cross sectional elevation view illustrative of an intelligent power device formed in an SOI substrate with of improved silicon oxide film patterns shown in FIG. 4 in a first embodiment in accordance with the present invention.

BRIEF DESCRIPTION OF PREFERRED EMBODIMENTS

Figure 6:
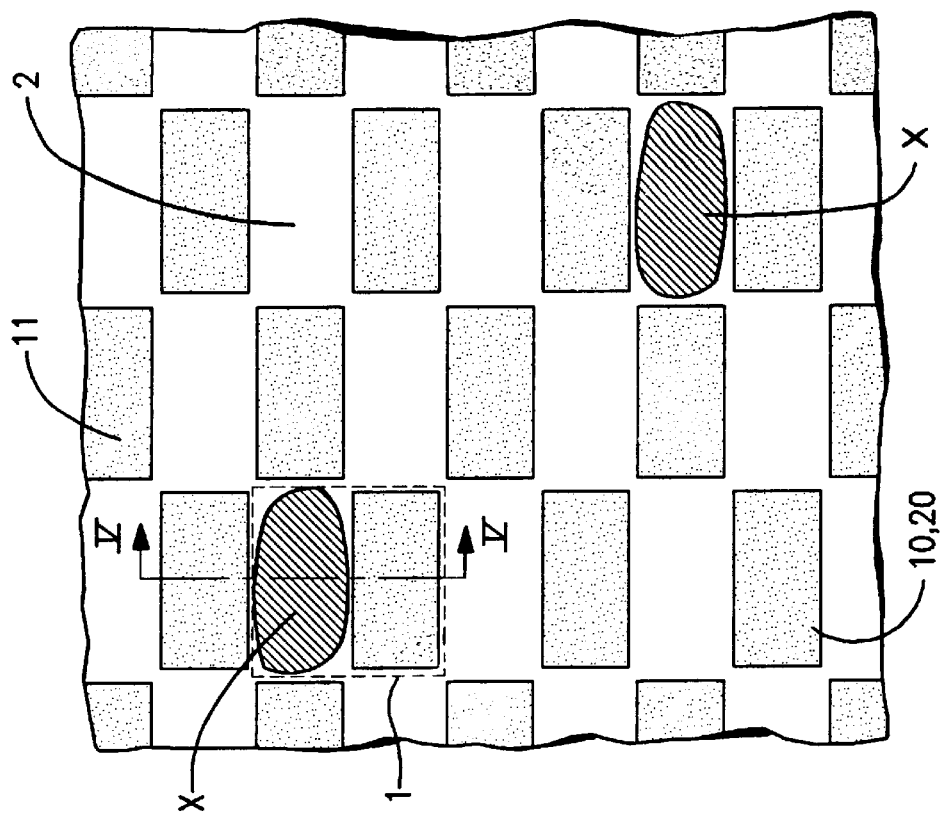
FIG. 6 is a plan view illustrative of improved insulation patterns and voids on an interface between first and second monocrystal silicon substrates of an SOI substrate shown in FIG. 4 in a first embodiment in accordance with the present invention.
Figure 4:
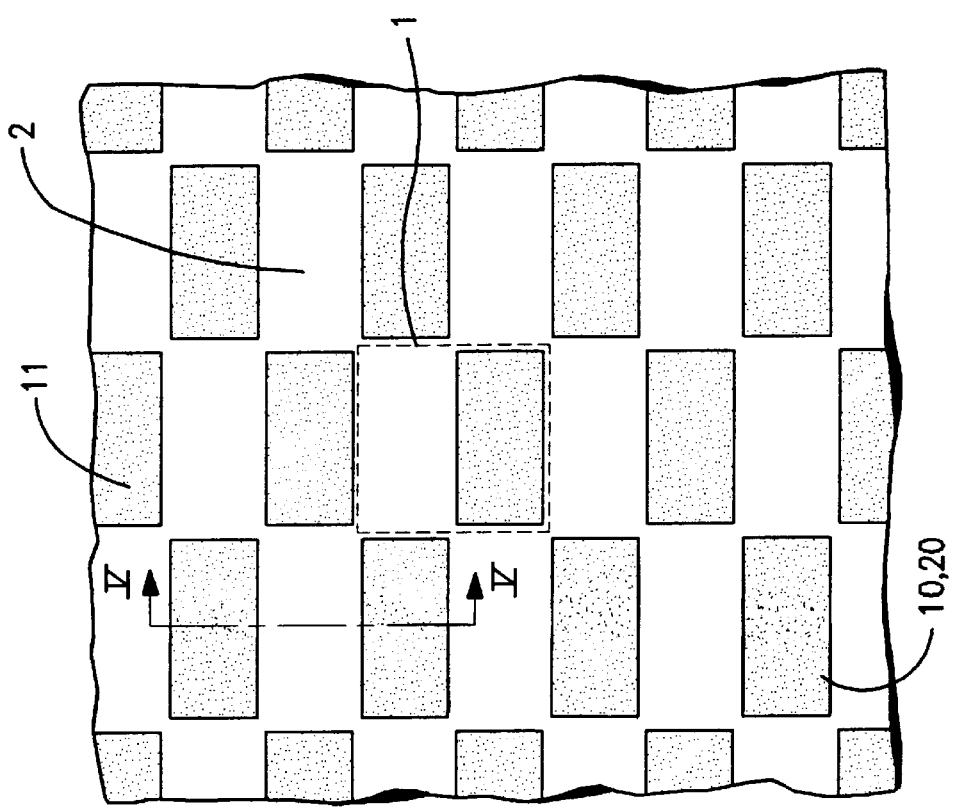
FIG. 4 is a plan view illustrative of improved silicon oxide film patterns of an SOI substrate in a first embodiment in accordance with the present invention.

A first embodiment according to the present invention will be described in detail with reference to FIGS. 4, 5 and 6. FIG. 4 is illustrative of improved silicon oxide film patterns of an SOI substrate. FIG. 5 is illustrative of generation of voids in the prior art. FIG. 6 is illustrative of improved insulation patterns and voids on an interface between first and second monocrystal silicon substrates of an SOI substrate shown in FIG. 4.

The SOI substrate has laminations of first and second monocrystal silicon substrates 10 and 20 bonded to each other. Silicon oxide film patterns 11 are selectively provided on an interface between the first and second monocrystal silicon substrates 10 and 20. The silicon oxide film patterns 11 serve as the buried insulation film buried in the SOI substrate. Namely, in directly bonding regions 2, no silicon oxide film patterns are provided so that the first and second monocrystal silicon substrates 10 and 20 are directly bonded to each other without an intervening insulation film pattern. On the other hand, in indirectly bonding regions, the silicon oxide film patterns 11 are provided so that the first and second monocrystal silicon substrates 10 and 20 are indirectly bonded to each other through the silicon oxide film patterns 11. In the directly bonding regions 2, vertical power MOS field effect transistor circuits are provided, whilst in the indirectly bonding regions the silicon oxide film patterns 11 and control circuits are provided. In the vertical power MOS field effect transistor circuit, a vertical power MOS field effect transistor has diffusion layers formed in a surface region of the first monocrystal silicon substrate 10. In the directly bonding region, a drain electrode of the vertical power MOS field effect transistor is provided on a surface of the second monocrystal silicon substrate 20. A drain electrode is placed on a bottom surface of the substrate and a drain current flows from the diffusion layers toward the bottom surface of the substrate. Namely, the interface between the first and second monocrystal silicon substrates 10 and 20 in the directly bonding region serves as a drain current path. This requires a physically and electrically perfect bonding between the first and second monocrystal silicon substrates 10 and 20 in the directly bonding region.

In the plan view, the silicon oxide film patterns 11 are periodical based upon the individual chip size. The silicon oxide film patterns 11 are periodical patterns having a periodicity based upon a size of areas of chips which are aligned in a matrix in laminations of said first and second silicon substrates and are to be cut therefrom. The silicon oxide film patterns 11 are in the shape of checkered patterns so that each of the directly bonding regions rectangular-shaped is bounded on all sides by the indirectly bonding regions on which the silicon oxide film patterns 11 are provided whilst each of the indirectly bonding regions having the silicon oxide film patterns is bounded on all sides by the directly bonding regions. The directly bonding regions and the indirectly bonding regions are alternately and periodically arranged in both first and second directions which are perpendicular to each other but parallel to the interface between the first and second monocrystal silicon substrates 10 and 20 to form the checkered patterns. Each of the indirectly bonding region 2 shears on the bottom half region of each of the chip areas 1. Each of the direct bonding region 2 shears on the top half region of each of the chip areas 1.

A void may be caused by differences in flatness of and heat treatment to the first and second monocrystal silicon substrates 10 and 20 of the SOI substrate. Actually, however, it is difficult to bond the first and second monocrystal silicon substrates 10 and 20 without formation of a void on the interface between them. The directly bonding regions 2 are inferior in bonding property than the indirectly bonding regions on which the silicon oxide film patterns 11 are provided on the interface between them. For this reason, the probability of formation of the void is higher in the directly bonding regions rather than in the indirectly bonding regions on which the silicon oxide film patterns 11 are provided on the interface between them. Further, the formation of the voids is caused by a difference in level or a step between the silicon oxide film patterns and the monocrystal silicon substrate surface. Conditions for the formation of the silicon oxide films vary over the substrate surface whereby some of the silicon oxide film patterns are higher in level than the monocrystal silicon substrate surface. In this case, the step or difference in level is formed between the silicon oxide film patterns and the monocrystal silicon substrate surface. For this reason, the indirect bonding between the first and second monocrystal silicon substrates 10 and 20 through the silicon oxide film pattern 11 is obtained prior to the direct bonding between the first and second monocrystal silicon substrates 10 and 20 without the silicon oxide film pattern 11. If the step or difference in level between the silicon oxide film patterns and the monocrystal silicon substrate surface is not so small, then the indirect bonding between the first and second monocrystal silicon substrates 10 and 20 through the silicon oxide film pattern 11 is obtained, whilst the direct bonding between the first and second monocrystal silicon substrates 10 and 20 without the silicon oxide film pattern 11 is difficult to obtain. Namely, the voids are likely to be formed in the direct bonding regions 2. Even when the voids are caused by the difference in level between the silicon oxide film patterns and the monocrystal silicon substrate surface or difference in bonding conditions, the voids are prevented from extending to the adjacent chip area because each of the direct bonding regions is surrounded by the indirect bonding regions on which the silicon oxide film patterns 11 are provided. Namely, the silicon oxide film patterns 11 surrounding the direct bonding region are capable of preventing the void in the direct bonding region from extending to the adjacent direct bonding region of the adjacent chip area. This prevention of such extensions of the voids to the adjacent chip area allows higher yield of the chips. For those reasons, the above novel SOI substrate with the improved insulator patterns is free from the problems with which the conventional SOI substrate is engaged.

Each of the above silicon oxide film patterns 11 may be 1 mm×2 mm. The above silicon oxide film patterns 11 may be formed by well-known photo-resist method and local oxidation of silicon method. The above silicon oxide film patterns 11 may have a thickness of about 1 micrometers.

The variations in size and thickness of the silicon oxide film patterns are design choices.

Figure 7:
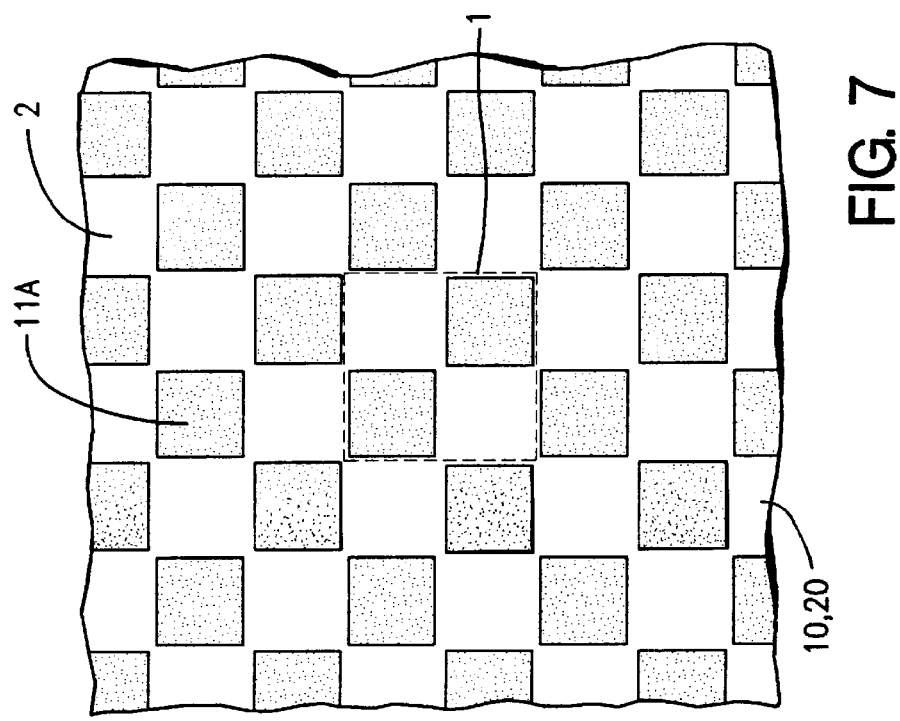
FIG. 7 is a plan view illustrative of improved silicon oxide film patterns of an SOI substrate in a second embodiment in accordance with the present invention.

A second embodiment according to the present invention will be described in detail with reference to FIG. 7 illustrative of improved insulation patterns and voids on an interface between first and second monocrystal silicon substrates of an SOI substrate. The SOI substrate has laminations of first and second monocrystal silicon substrates 10 and 20 bonded to each other. Silicon oxide film patterns 11A are selectively provided on an interface between the first and second monocrystal silicon substrates 10 and 20. The silicon oxide film patterns 11A serve as the buried insulation film buried in the SOI substrate. Namely, in directly bonding regions 2, no silicon oxide film patterns are provided so that the first and second monocrystal silicon substrates 10 and 20 are directly bonded to each other without an intervening insulation film pattern. On the other hand, in indirectly bonding regions, the silicon oxide film patterns 11A are provided so that the first and second monocrystal silicon substrates 10 and 20 are indirectly bonded to each other through the silicon oxide film patterns 11A. In the directly bonding regions 2, vertical power MOS field effect transistor circuits are provided, whilst in the indirectly bonding regions the silicon oxide film patterns 11A and control circuit are provided. In the vertical power MOS field effect transistor circuit, a vertical power MOS field effect transistor has diffusion layers formed in a surface region of the first monocrystal silicon substrate 10. In the indirectly bonding region, a drain electrode of the vertical power MOS field effect transistor is provided on a surface of the second monocrystal silicon substrate 20. The vertical power MOS field effect transistor flows a drain current from the diffusion layers toward the drain electrode through the interface between the first and second monocrystal silicon substrates 10 and 20. Namely, the interface between the first and second monocrystal silicon substrates 10 and 20 in the indirectly bonding region serves as a drain current path. This requires a physically and electrically perfect bonding between the first and second monocrystal silicon substrates 10 and 20 in the indirectly bonding region.

In the plan view, the silicon oxide film patterns 11A are periodical based upon the individual chip size. The silicon oxide film patterns 11A are periodical patterns having a periodicity based upon a size of areas of chips which are aligned in matrix in laminations of said first and second silicon substrates and are to be cut therefrom. The silicon oxide film patterns 11A are in the shape of checkered patterns so that each of the directly bonding regions square-shaped is bounded on all sides by the indirectly bonding regions on which the silicon oxide film patterns 11A are provided whilst each of the indirectly bonding regions having the silicon oxide film patterns is bounded on all sides by the directly bonding regions. The directly bonding regions and the indirectly bonding regions are alternately and periodically arranged in both first and second directions which are perpendicular to each other but parallel to the interface between the first and second monocrystal silicon substrates 10 and 20 to form the checkered patterns. Two of the indirectly bonding regions square-shaped shear on first and third quarter regions of each of the chip areas 1 so that the two of the indirectly bonding square-shaped regions 2 are arranged at diagonally opposite first and third quarter regions of each of the chip areas 1. Two of the direct bonding regions 2 shear on second and fourth quarter regions of each of the chip areas 1 so that the two of the directly bonding regions 2 square-shaped are arranged at diagonally opposite second and fourth quarter regions of each of the chip areas 1. Those arrangements of two sets of the direct and indirect bonding regions in each chip area would periodically extend over the interface between the first and second monocrystal silicon substrates 10 and 20.

Any void may be caused by differences in flatness of and heat treatment to the first and second monocrystal silicon substrates 10 and 20 of the SOI substrate. Actually, however, it is difficult to bond the first and second monocrystal silicon substrates 10 and 20 without formation of a void on the interface between them. The directly bonding regions 2 are inferior in bonding property than the indirectly bonding regions on which the silicon oxide film patterns 11A are provided on the interface between them. For this reason, the probability of formation of the void is higher in the directly bonding regions rather than in the indirectly bonding regions on which the silicon oxide film patterns 11A are provided on the interface between them. Further, the formation of the voids is caused by a difference in level or a step between the silicon oxide film patterns and the monocrystal silicon substrate surface. Conditions for the formation of the silicon oxide films vary over the substrate surface whereby some of the silicon oxide film patterns are higher in level than the monocrystal silicon substrate surface. In this case, the step or difference in level is formed between the silicon oxide film patterns and the monocrystal silicon substrate surface. For this reason, the indirect bonding between the first and second monocrystal silicon substrates 10 and 20 through the silicon oxide film pattern 11A is obtained prior to the direct bonding between the first and second monocrystal silicon substrates 10 and 20 without the silicon oxide film pattern 11A. If the step or difference in level between the silicon oxide film patterns and the monocrystal silicon substrate surface is not so small, then the indirect bonding between the first and second monocrystal silicon substrates 10 and 20 through the silicon oxide film pattern 11A is obtained, whilst the direct bonding between the first and second monocrystal silicon substrates 10 and 20 without the silicon oxide film pattern 11A is difficult to obtain. Namely, the voids are likely to be formed in the direct bonding regions 2. Even when the voids are caused by the difference in level between the silicon oxide film patterns and the monocrystal silicon substrate surface or difference in bonding conditions, the voids are prevented from extending to the adjacent chip area because each of the direct bonding regions is surrounded by the indirect bonding regions on which the silicon oxide film patterns 11A are provided. Namely, the silicon oxide film patterns 11A surrounding the direct bonding region are capable of preventing the void in the direct bonding region from extending to the adjacent direct bonding region of the adjacent chip area. This prevention of such extensions of the voids to the adjacent chip area allows higher yield of the chips. For those reasons, the above novel SOI substrate with the improved insulator patterns is free from the problems with which the conventional SOI substrate is engaged. The variations in size and thickness of the silicon oxide film patterns are design choices.

Figure 8:
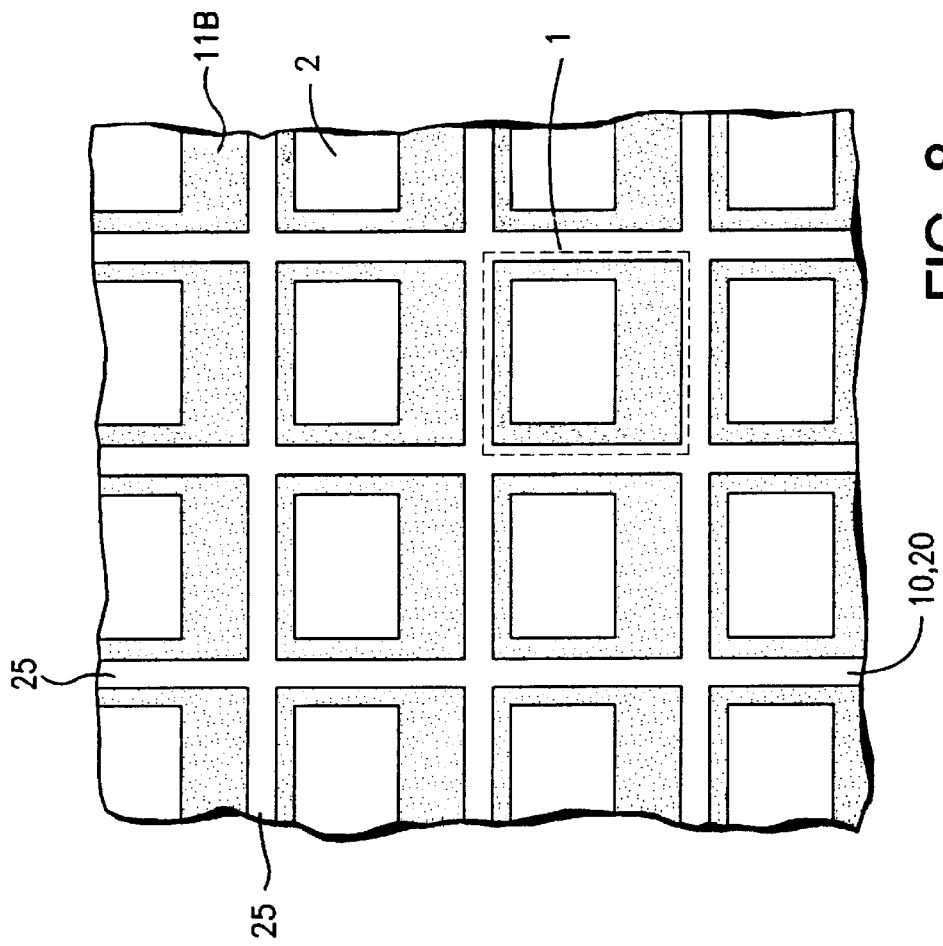
FIG. 8 is a plan view illustrative of improved silicon oxide film patterns of an SOI substrate in a third embodiment in accordance with the present invention.

A third embodiment according to the present invention will be described in detail with reference to FIG. 8 illustrative of improved insulation patterns and voids on an interface between first and second monocrystal silicon substrates of an SOI substrate. The SOI substrate has laminations of first and second monocrystal silicon substrates 10 and 20 bonded to each other. Silicon oxide film patterns 11B are selectively provided on an interface between the first and second monocrystal silicon substrates 10 and 20. The silicon oxide film patterns 11B serve as the buried insulation film buried in the SOI substrate. Namely, in directly bonding regions 2, no silicon oxide film patterns are provided so that the first and second monocrystal silicon substrates 10 and 20 are directly bonded to each other without an intervening insulation film pattern. On the other hand, in indirectly bonding regions, the silicon oxide film patterns 11B are provided so that the first and second monocrystal silicon substrates 10 and 20 are indirectly bonded to each other through the silicon oxide film patterns 11B. In the directly bonding regions 2, vertical power MOS field effect transistor circuits are provided, whilst in the indirectly bonding regions the silicon oxide film patterns 11B and control circuits are provided. In the vertical power MOS field effect transistor circuit, a vertical power MOS field effect transistor has diffusion layers formed in a surface region of the first monocrystal silicon substrate 10. In the directly bonding region, a drain electrode of the vertical power MOS field effect transistor is provided on a surface of the second monocrystal silicon substrate 20. The vertical power MOS field effect transistor flows a drain current from the diffusion layers toward the drain electrode through the interface between the first and second monocrystal silicon substrates 10 and 20. Namely, the interface between the first and second monocrystal silicon substrates 10 and 20 in the directly bonding region serves as a drain current path. This requires a physically and electrically perfect bonding between the first and second monocrystal silicon substrates 10 and 20 in the directly bonding region.

In the plan view, the silicon oxide film patterns 11B are periodical based upon the individual chip size. The silicon oxide film patterns 11 are periodical patterns having a periodicity based upon a size of areas of chips which are aligned in matrix in laminations of the first and second silicon substrates and are to be cut therefrom. The silicon oxide film patterns 11B are aligned in a matrix and separated from each other by scribe line regions 25 in which the first and second monocrystal silicon substrates 10 and 20 are directly bonded to each other. An external shape or peripheral sides are defined as a square shape which correspond to the individual chip area. Each silicon oxide film pattern 11B has an opening which is rectangular-shaped. This opening of the silicon oxide film pattern 11B allows the existence of the directly bonding region on which the first and second monocrystal silicon substrates 10 and 20 are directly bonded to each other. The opening of the each silicon oxide film pattern 11B is surrounded by the each silicon oxide film pattern 11B. Namely, the directly bonding region 2 is surrounded by the each silicon oxide film pattern 11B.

Any void may be caused by differences in flatness of and heat treatment to the first and second monocrystal silicon substrates 10 and 20 of the SOI substrate. Actually, however, it is difficult to bond the first and second monocrystal silicon substrates 10 and 20 without formation of a void on the interface between them. The directly bonding regions 2 are inferior in bonding property than the indirectly bonding regions on which the silicon oxide film patterns 11B are provided on the interface between them. For this reason, the probability of formation of the void is higher in the directly bonding regions rather than in the indirectly bonding regions on which the silicon oxide film patterns 11B are provided on the interface between them. Further, the formation of the voids is caused by a difference in level or a step between the silicon oxide film patterns and the monocrystal silicon substrate surface. Conditions for the formation of the silicon oxide films vary over the substrate surface whereby some of the silicon oxide film patterns are higher in level than the monocrystal silicon substrate surface. In this case, the step or difference in level is formed between the silicon oxide film patterns and the monocrystal silicon substrate surface. For this reason, the indirect bonding between the first and second monocrystal silicon substrates 10 and 20 through the silicon oxide film pattern 11B is obtained prior to the direct bonding between the first and second monocrystal silicon substrates 10 and 20 without the silicon oxide film pattern 11B. If the step or difference in level between the silicon oxide film patterns and the monocrystal silicon substrate surface is not so small, then the indirect bonding between the first and second monocrystal silicon substrates 10 and 20 through the silicon oxide film pattern 11B is obtained, whilst the direct bonding between the first and second monocrystal silicon substrates 10 and 20 without the silicon oxide film pattern 11B is difficult to obtain. Namely, the voids are likely to be formed in the direct bonding regions 2. Even when the voids are caused by the difference in level between the silicon oxide film patterns and the monocrystal silicon substrate surface or difference in bonding conditions, the voids are prevented from extending to the adjacent chip area because each of the direct bonding regions is surrounded by the indirect bonding regions on which the silicon oxide film patterns 11B are provided. Namely, the silicon oxide film patterns 11B surrounding the direct bonding region are capable of preventing the void in the direct bonding region from extending to the adjacent direct bonding region of the adjacent chip area. This prevention of such extensions of the voids to the adjacent chip area allows higher yield of the chips. For those reasons, the above novel SOI substrate with the improved insulator patterns is free from the problems with which the conventional SOI substrate is engaged. The variations in size and thickness of the silicon oxide film patterns are design choices.

Further, in the various embodiments instead of the silicon oxide films, silicon nitride films or other insulation films are also available.

For bonding the first and second monocrystal silicon substrates, a heat treatment may preferably be carried out at a temperature of not less than 1100° C. for not less than two hours.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A silicon-on-insulator substrate comprising a first silicon substrate, a second silicon substrate bonded to said first silicon substrate, a plurality of insulation film patterns formed on a plurality of first type regions of an interface between said first and second silicon substrates, so that said first and second silicon substrates on said plurality of first type regions are indirectly bonded through said plurality of insulation film patterns whilst said first and second silicon substrates on a plurality of second type regions are directly bonded to each other, wherein each of said plurality of first type regions is bounded on all sides by said plurality of second type regions whilst each of said plurality of second type regions is bounded on all sides by said plurality of first type regions.

2. The silicon-on-insulator substrate as claimed in claim 1, wherein said plurality of insulation film patterns provided on said plurality of first type regions are in the shape of checkered patterns.

3. The silicon-on-insulator substrate as claimed in claim 2, wherein at least one pair of said first and second type regions is included in each chip which is to be cut therefrom.

4. The silicon-on-insulator substrate as claimed in claim 3, wherein two pairs of said first and second type regions are included in each said chip.

5. The silicon-on-insulator substrate as claimed in claim 1, wherein said plurality of insulation film patterns provided on said plurality of first type regions are periodical patterns having a periodicity based upon a size of chips which are aligned in matrix in laminations of said first and second substrates and are to be cut therefrom.

6. The silicon-on-insulator substrate as claimed in claim 5, wherein at least one of said first type regions and at least one of said second type regions are included in each of the chips, and wherein said at least one of said second type regions is surrounded by said at least one of said first type regions in said chips.

7. The silicon-on-insulator substrate as claimed in claim 1, wherein said first and second type regions are alternately and periodically arranged in both first and second directions which are perpendicular to each other but parallel to said interface.

8. The silicon-on-insulator substrate as claimed in claim 1, wherein said first and second type regions have the same size and the same geometrical shape.

9. The silicon-on-insulator substrate as claimed in claim 1, wherein control circuits are formed in the first type regions whilst vertical power MOS transistors are formed in the second type regions.

10. A silicon-on-insulator substrate comprising a first silicon substrate, a second silicon substrate bonded to said first silicon substrate, a plurality of insulation film patterns formed on a plurality of first type regions of an interface between said first and second silicon substrates, so that said first and second silicon substrates on said plurality of first type regions are indirectly bonded through said plurality of insulation film patterns whilst said first and second silicon substrates on a plurality of second type regions are directly bonded to each other, wherein each of said plurality of second type regions is bounded on all sides by a respective one of said plurality of first type regions.

11. The silicon-on-insulator substrate as claimed in claim 10, wherein at least one pair of said first and second type regions is included in each chip which is to be cut therefrom.

12. The silicon-on-insulator substrate as claimed in claim 10, wherein said first type regions are square and said second type regions are rectangles that are each completely enclosed within a respective one of said squares.

13. The silicon-on-insulator as claimed in claim 10, wherein control circuits are formed in the first type regions whilst vertical power MOS transistors are formed in the second type regions.

14. A silicon-on-insulator substrate comprising a first silicon substrate, a second silicon substrate bonded to said first silicon substrate, a plurality of insulation film patterns formed on a plurality of first type regions of an interface between said first and second silicon substrates, so that said first and second silicon substrates on said plurality of first type regions are indirectly bonded through said plurality of insulation film patterns whilst said first and second silicon substrates on a plurality of second type regions are directly bonded to each other, wherein said first and second type regions are alternately and periodically arranged in both first and second directions which are perpendicular to each other and parallel to said interface, and wherein two pairs of said first and second type regions are included in each chip cut from said substrate.

15. The silicon-on-insulator substrate as claimed in claim 14, wherein plurality of insulation film patterns provided on said plurality of first type regions are in the shape of checkered patterns.

16. The silicon-on-insulator substrate as claimed in claim 14, wherein said plurality of insulation film patterns provided on said plurality of first type regions are periodical patterns having a periodicity based upon a size of the chip.

17. The silicon-on-insulator substrate as claimed in claim 16, wherein said at least one of said second type regions is surrounded by said at least one of said first type regions in said chip.

18. The silicon-on-insulator substrate as claimed in claim 14, wherein said first and second type regions have the same size and the same geometrical shape.

19. The silicon-on-insulator substrate as claimed in claim 14, wherein control circuits are formed in the first type regions whilst vertical power MOS transistors are formed in the second type regions.

* * * * *